(12) United States Patent
Qiu et al.

(10) Patent No.: US 11,218,581 B2
(45) Date of Patent: Jan. 4, 2022

(54) DISPLAY APPARATUS

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Haijun Qiu, Beijing (CN); Guoqiang Ma, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 800 days.

(21) Appl. No.: 16/067,119

(22) PCT Filed: Dec. 7, 2017

(86) PCT No.: PCT/CN2017/114999
§ 371 (c)(1),
(2) Date: Jun. 28, 2018

(87) PCT Pub. No.: WO2018/218916
PCT Pub. Date: Dec. 6, 2018

(65) Prior Publication Data
US 2021/0173605 A1 Jun. 10, 2021

(30) Foreign Application Priority Data
May 27, 2017 (CN) .................. 201710393797.X

(51) Int. Cl.
G06F 3/14 (2006.01)
G06F 1/16 (2006.01)
(Continued)

(52) U.S. Cl.
CPC ........ H04M 1/0266 (2013.01); G06F 1/1647 (2013.01); G06F 1/1652 (2013.01);
(Continued)

(58) Field of Classification Search
CPC .... G06F 3/1431; G06F 1/1647; G06F 1/1652; G06F 3/041; G06F 3/147;
(Continued)

(56) References Cited

U.S. PATENT DOCUMENTS

2009/0085920 A1* 4/2009 Teng .................. G06F 3/1415
345/520
2010/0164836 A1* 7/2010 Liberatore ............ G06F 1/1647
345/1.1
(Continued)

FOREIGN PATENT DOCUMENTS

CN 204833938 U 12/2015
CN 107734084 A 2/2018
(Continued)

OTHER PUBLICATIONS

CN First Office Action in Application No. 201710393797-X, dated Sep. 19, 2019.
(Continued)

Primary Examiner — Afroza Chowdhury
(74) Attorney, Agent, or Firm — Syncoda LLC; Feng Ma

(57) ABSTRACT

A display apparatus includes a plurality of display panels, a mounting frame, and a central control circuit. The mounting frame includes a side ridge electrically coupled to each of the plurality of display panels. The central control circuit is arranged inside the side ridge. The plurality of display panels are arranged such that a side edge of each of the plurality of display panels is attached to the side ridge to thereby allow the each of the plurality of display panels to be flipped open or close along the side ridge. The central (Continued)

control circuit is electrically coupled to each of the plurality of display panels, and is configured to control a display state of each of the plurality of display panels upon receiving a control signal from a user.

20 Claims, 10 Drawing Sheets

(51) Int. Cl.
| | |
|---|---|
| *G06F 3/041* | (2006.01) |
| *G06F 3/147* | (2006.01) |
| *G06K 9/00* | (2006.01) |
| *G09G 3/3208* | (2016.01) |
| *H01L 25/065* | (2006.01) |
| *H01L 51/52* | (2006.01) |
| *H04M 1/02* | (2006.01) |

(52) U.S. Cl.
CPC ............... *G06F 3/041* (2013.01); *G06F 3/147* (2013.01); *G06F 3/1431* (2013.01); *G06K 9/00013* (2013.01); *G09G 3/3208* (2013.01); *H01L 25/0657* (2013.01); *H01L 51/5237* (2013.01); *H04M 1/0268* (2013.01); *G06F 2203/04102* (2013.01); *G09G 2360/04* (2013.01); *G09G 2380/02* (2013.01); *H01L 2225/06582* (2013.01); *H01L 2251/5338* (2013.01)

(58) Field of Classification Search
CPC ...... G06F 2203/04102; G06K 9/00013; G09G 3/3208; G09G 2360/04; G09G 2380/02; H01L 25/0657; H01L 51/5237; H01L 2225/06582; H01L 2251/5338; H04M 1/0268

See application file for complete search history.

(56) References Cited

U.S. PATENT DOCUMENTS

| | | | |
|---|---|---|---|
| 2010/0277443 A1* | 11/2010 | Yamazaki | ........... G02F 1/13452 345/204 |
| 2015/0022980 A1* | 1/2015 | Van Den Brink | ..... H05K 1/028 361/749 |
| 2016/0282993 A1 | 9/2016 | Song | |

FOREIGN PATENT DOCUMENTS

| | | |
|---|---|---|
| TW | 531107 U | 10/2016 |
| TW | M531107 U | 10/2016 |

OTHER PUBLICATIONS

CN Second Office Action in Application No. 201710393797-X, dated Apr. 14, 2020.

International Search Report and Written Opinion dated Mar. 23, 2018 in PCT/CN2017/114999.

\* cited by examiner

DISPLAY APPARATUS

CROSS-REFERENCE TO RELATED APPLICATION

The present application claims priority to Chinese Patent Application No. 201710393797.X, filed on May 27, 2017, the disclosure of which is hereby incorporated by reference in its entirety.

TECHNICAL FIELD

The present disclosure relates generally to the field of display technologies, and more specifically to a display apparatus.

BACKGROUND

With the increasing demand for life quality, more and more people want to separate their life and work. To achieve this goal, it typically requires the use of two terminal devices, which typically include mobile phones, tablets, etc. As such, it not only increases the cost of living, but also increase a total weight for people to carry belongings on the way.

In order to solve this problem, an existing technology has been developed, which involves a mobile phone equipped with two or more different systems. The two and more systems can be used for family life and work, respectively.

Although by implementing the above mobile phone with two systems, one's life and work can be divided, the fact that these two different systems exist in one single mobile phone can easily result in an interference between these two systems, which in turn can make a control of the system prone to errors, leading to a reduced user experience.

As such, how to effectively divide a user's work and life through one single terminal device with control errors being effectively controlled, has become a challenge that needs to be effectively addressed.

SUMMARY

In a first aspect, the present disclosure provides a display apparatus. The display apparatus comprises a plurality of display panels, a mounting frame, and a central control circuit.

The mounting frame includes a side ridge that is electrically coupled to each of the plurality of display panels. The central control circuit is arranged inside the side ridge. The plurality of display panels are arranged such that a side edge of each of the plurality of display panels is attached to the side ridge to thereby allow the each of the plurality of display panels to be flipped open or close along the side ridge. The central control circuit is electrically coupled to each of the plurality of display panels, and is configured to control a display state of each of the plurality of display panels upon receiving a control signal from a user.

According to some embodiments of the display apparatus, the mounting frame further comprises a bottom plate attached to the side ridge. The plurality of display panels comprise a first display panel and at least one second display panel, which are arranged such that a non-display surface of the first display panel is mounted onto the bottom plate, and the at least one second display panel is disposed over a surface of the first display panel opposing to the bottom plate.

In the display apparatus, at least one pair of two adjacent display panels can be arranged such that a non-display surface of each of the two adjacent display panels is attached to one another to substantially form a duel side-display panel assembly.

Herein the non-display surface of the each of the two adjacent display panels that form a duel side-display panel assembly can be attached to one another via a layer of an optically clear adhesive (OCA).

In the display apparatus, each of the plurality of display panels is electrically coupled to the side ridge via a coupling between a first coupling portion on the side ridge and a second coupling portion on the each of the plurality of display panels and corresponding to the first coupling portion.

According to some embodiments of the display apparatus as described above, the first coupling portion and the second coupling portion are respectively one and another of a slot or a plugging portion.

According to some other embodiments of the display apparatus as described above, the coupling between the first coupling portion on the side ridge and the second coupling portion on the each of the plurality of display panels is a contact connection. As such, the first coupling portion and the second coupling portion are respectively one and another of a contact circuit or a corresponding contact circuit.

Herein the contact circuit can be a chip-on-film (COF) circuit or a flexible printed circuit (FPC).

In some embodiments of the display apparatus having a contact connection between the first coupling portion on the side ridge and the second coupling portion on the each of the plurality of display panels, each of the at least one second display panel can include a bent region, and the second coupling portion is arranged in the bent region.

According to some embodiments of the display apparatus, the side ridge is provided with a larger number of the first coupling portions than the plurality of display panels.

In the display apparatus, the mounting frame can further include at least one rim, configured to form an accommodating housing along with the side ridge and the bottom plate, and the first display panel can be disposed in the accommodating housing.

According to some embodiments, the display apparatus further includes a display control portion. The display control portion can include at least one display controller. Each of the at least one display controller is arranged on a surface of the mounting frame other than the accommodating housing, is electrically coupled to the central control circuit, and is configured to receive a control signal from the user, and then to send the control signal to the central control circuit.

In the display apparatus as described above, the display control portion consists of one display controller. As such, the control signal can include a first control sub-signal, which is configured to control a display state of one of the plurality of display panels. Alternatively, the control signal can include a second control sub-signal, which is configured to control a display state of two of the plurality of display panels.

According to some embodiments of the display apparatus, the display control portion comprises a wake-up display controller, a single-panel display controller, a double-panel display controller, and a double-mode display controller.

The wake-up display controller is configured to receive a third control sub-signal from the user, and then to send the third control signal to the central control circuit for waking up one of the plurality of display panels for display.

The single-panel display controller is configured to receive a fourth control sub-signal from the user, and then to send the fourth control sub-signal to the central control circuit for allowing one of the plurality of display panels to display.

The double-panel display controller is configured to receive a fifth control sub-signal from the user, and then to send the fifth control sub-signal to the central control circuit for allowing two of the plurality of display panels to display.

The double-mode display controller is configured receive a sixth control sub-signal from the user, and then to send the sixth control sub-signal to the central control circuit for starting two different modes for two of the plurality of display panels.

In the display apparatus, each of the at least one display controller in the display control portion can include at least one of a physical button or a touch-control button.

According to some embodiments of the present disclosure, the display apparatus further includes at least one functional slot, which are electrically coupled to the central control circuit. The at least one functional slot is configured to be plugged in by one or more functional cards to thereby allow addition or expansion of one or more functionalities for the display apparatus.

According to some embodiments of the present disclosure, the display apparatus further includes at least one sensor, which is electrically coupled to the central control circuit, and is configured to detect, and to send to the central control circuit, at least one of biometrics information or control signal from the user.

According to some embodiments of the present disclosure, the display apparatus further includes a transparent flexible cover, which is disposed over a surface of the at least one second display panel opposing to the bottom plate. A side edge of the transparent flexible cover is attached to the side ridge of the mounting frame.

In any of embodiments of the display apparatus as described above, the plurality of display panels can comprise at least one flexible display panel. Herein each of the at least one flexible display panel can be an OLED display panel.

BRIEF DESCRIPTION OF THE DRAWINGS

To more clearly illustrate some of the embodiments, the following is a brief description of the drawings. The drawings in the following descriptions are only illustrative of some embodiment. For those of ordinary skill in the art, other drawings of other embodiments can become apparent based on these drawings.

DETAILED DESCRIPTION

Figure 1A:
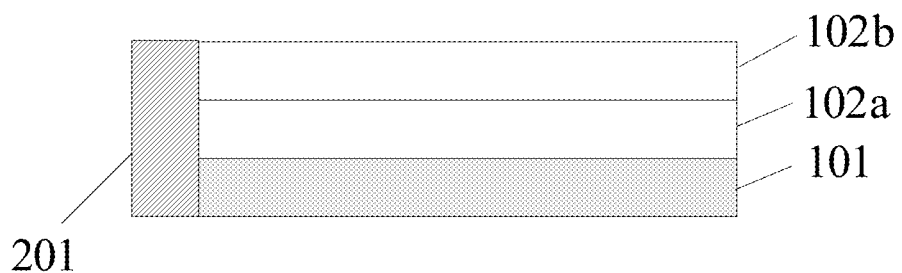
FIG. 1A illustrates a side view of a structural diagram of a display apparatus according to some embodiments of the disclosure.

In the following, with reference to the drawings of various embodiments disclosed herein, the technical solutions of the embodiments of the disclosure will be described in a clear and fully understandable way.

It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

An electroluminescence display panel, such as an organic light-emitting diode (OLED) display panel, because of its advantageous characteristics such as fast response, wide color gamut, wide viewing angle, high brightness, being flexible, and light weight, has received much attention and has been widely applied in many fields, such as mobile phones, tablets, computer monitors.

Herein, by taking an advantage of the aforementioned characteristics of a flexible OLED display panel, including being flexible and having a light weight, the present disclosure provides a display apparatus.

The display apparatus comprises a plurality of display panels, a mounting frame, and a central control circuit.

The plurality of display panels are each configured to display a different content whose display state can be independently controlled by the central control circuit. A side edge of each of the plurality of display panels is attached onto a side ridge of a mounting frame, such that each of the plurality of display panels can be flipped open or close along the side ridge.

The mounting frame comprises the side ridge and is configured to provide a frame to mount the plurality of display panels thereonto. The central control circuit is configured to control a display state of each of the plurality of display panels, such that each display panel can display a different content based on different requirements of a user to thereby meet the user's needs for multiple display modes.

These multiple display modes can include a work mode, a family life mode, and an entertainment mode, etc. Thus the display apparatus allows a display of a different content on a different display panel according to a different mode, as such, the display panel is expected to be able to effectively divide one's work and life through this single display apparatus, yet the issues that are associated with an existing technology where one display apparatus (e.g. a mobile phone) is equipped with two or more systems for different modes, such as the interferences among these two or more systems, and the accompanying errors in accurate control thereof, can be effectively solved.

In addition, because each display panel can be a flexible display panel (such as an OLED display panel) which is relatively thin and light, thus even if the display apparatus contains multiple such display panels, the display apparatus as a whole has a weight that is comparable to a weight of a traditional liquid crystal display (LCD) panel, thereby offering a feasibility to, and providing a convenience to, satisfy the needs of a user for multiple modes.

Figure 1B:
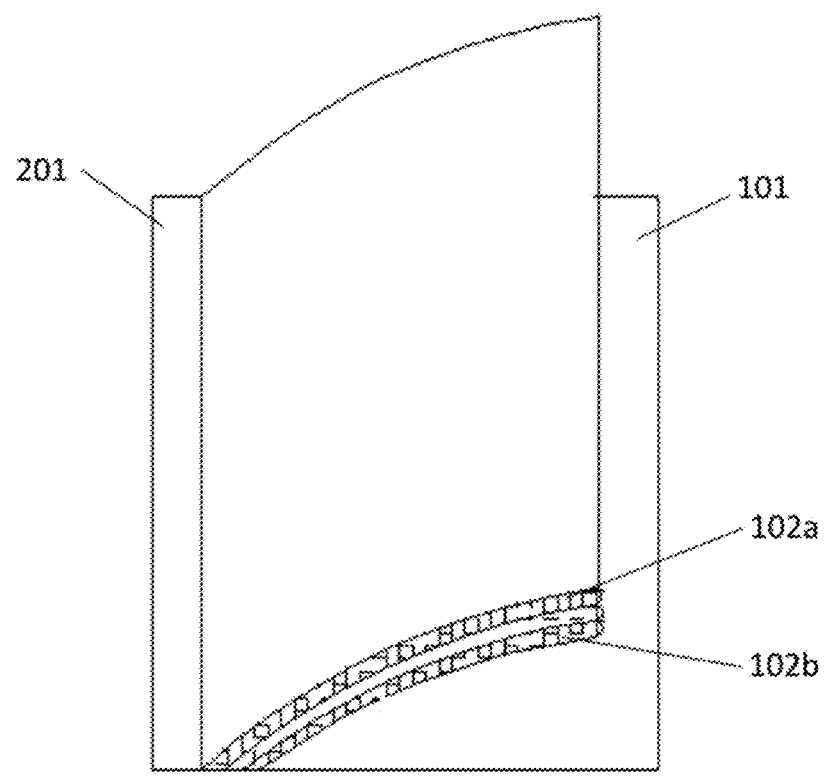
FIG. 1B illustrates a three-dimensional view of the display apparatus mentioned in FIG. 1A.

FIG. 1A and FIG. 1B illustrates a display apparatus according to some embodiments of the disclosure, where a side view and a three-dimensional view of the display apparatus are respectively shown.

As illustrated in FIG. 1A and FIG. 1B, the display apparatus substantially includes a total of three display panels (respectively shown as 101, 102a, and 102b), a mounting frame, and a central control circuit.

Figure 2A:
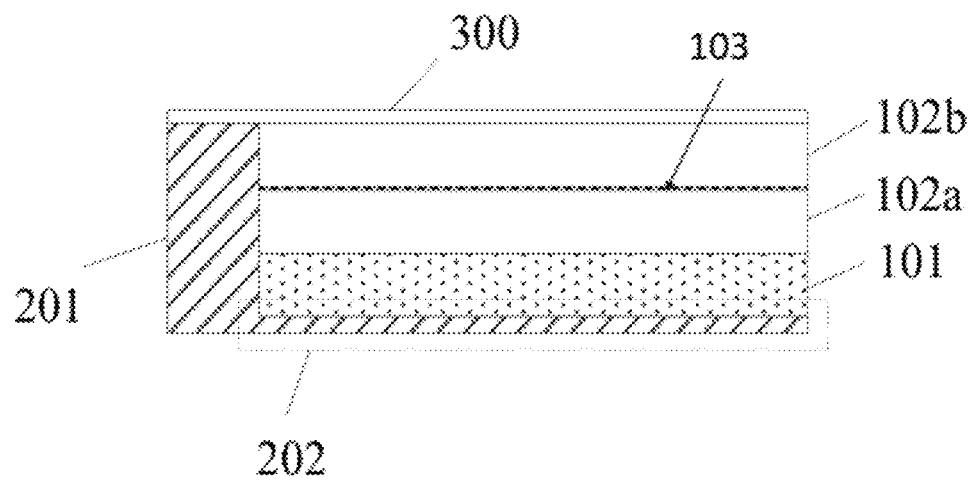
FIG. 2A illustrates a side view of a structural diagram of a display apparatus according to some embodiments of the disclosure.
Figure 2B:
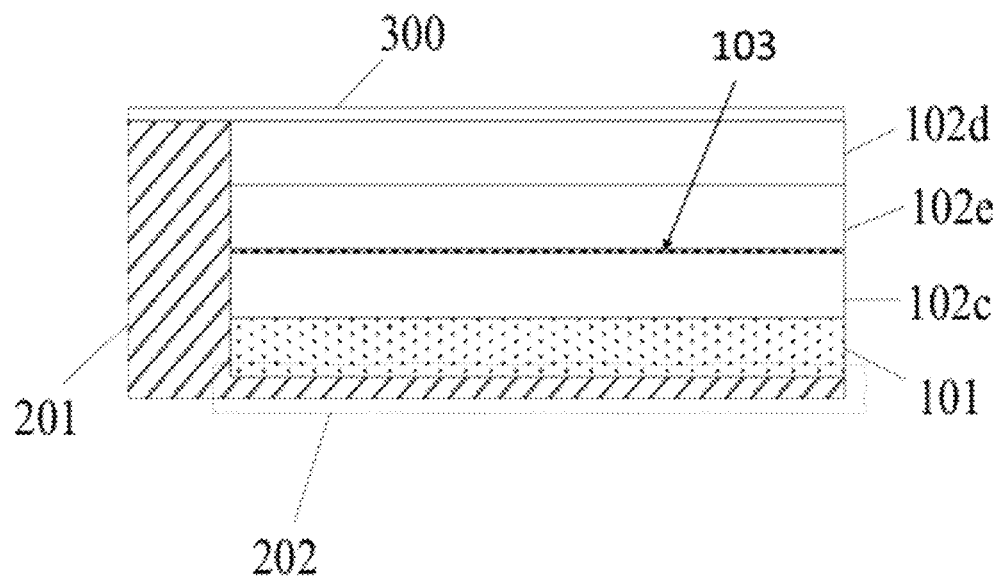
FIG. 2B illustrates a side view of a structural diagram of a display apparatus according to some other embodiments of the disclosure.

The three display panels 101, 102a and 102b are each arranged such that a side edge of each display panel is attached to the side ridge 201 of the mounting frame, configured to be flipped open or close along the side ridge 201 (shown as the two headed arrow in FIG. 2B). As such, the three display panels 101, 102a and 102b substantially form three pages of a book that can each be conveniently flipped open or close along the side ridge 201 of the mounting frame.

The central control circuit is arranged inside the side ridge 201 of the mounting frame. In order to allow an electrical coupling, or an electrical connection, between each of the three display panels 101, 102a and 102b with the central control circuit, the side edge of each of the plurality of display panels is further configured to be electrically coupled or connected to the side ridge 201.

In the display apparatus as described above, the display apparatus comprises a plurality of display panels (or more specifically three display panels). Each display panel is configured to display a different content, and as such, a user's need for multiple display modes can be satisfied. These multiple display modes can include a work mode, a family mode, an entertainment mode, and a tablet mode, etc.

For example, in one specific embodiment of the display apparatus, the display panel 102b is specifically for the work mode, the display panel 102a is specifically for the family life mode, and the display panel 101 is specifically for the entertainment mode. In addition, the display panel 102a can be used as a display panel for displaying a content, and the display panel 102b can be used as a touch-control panel, which substantially constitute the tablet mode for the display apparatus.

In addition, the central control circuit is employed as one single central control system to control a display state of each of the plurality of display panels in the display apparatus to thereby realize a different display mode, therefore the errors that are commonly associated with control of each different system in a same mobile phone according to some existing technologies can be effectively solved, and the control accuracy can also be improved.

Furthermore, each of the display panels in the display apparatus can be conveniently flipped open or flipped close based on different user needs for different display modes. As such, a user can operate the display apparatus like opening and/or closing a book, resulting in an improved user experience for the display apparatus disclosed herein.

According to some embodiments of the display apparatus, each of the plurality of display panels is a flexible display panel, which can be, for example, an OLED display panel, or more preferably an AMOLED display panel. Because an OLED display panel has an advantage of being flexible, thus the display quality of each of the display panels in the display apparatus can be minimally influenced when flipped open or close.

In addition, because an OLED display panel is advantageous over a traditional LCD display panel by being relatively thinner and lighter, the display apparatus having an OLED display panel as each of the plurality of display panels is thus thin and has a light weight, which can bring a convenience for carrying.

Figure 2C:
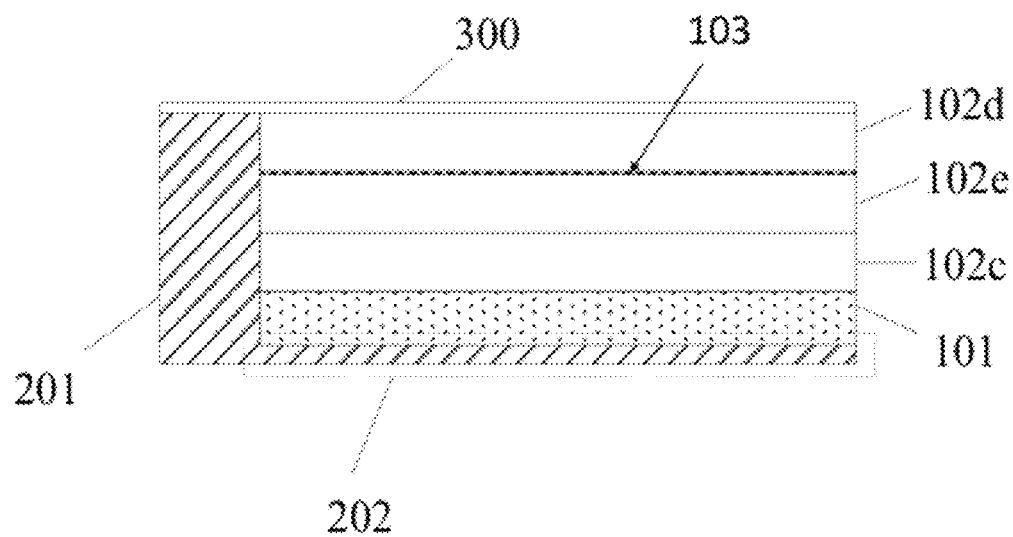
FIG. 2C illustrates a side view of a structural diagram of a display apparatus according to yet some other embodiments of the disclosure.

FIG. 2A, FIG. 2B, and FIG. 2C each illustrate a display apparatus according to a different embodiment of the disclosure.

In all of embodiments of the display apparatus as shown in FIGS. 2A, 2B and 2C, the mounting frame further comprises a bottom plate 202 that is attached to the side ridge 201.

Further as shown in the figures, the plurality of display panels includes a first display panel 101, and at least one second display panel 102 (shown as 102a, 102b, 102c, etc. in the figures). A non-display surface of the first display panel 101 is mounted onto a top surface of the bottom plate 202. The at least one second display panel 102 (e.g. 102a, 102b, 102c) is disposed over a surface of the first display panel 101 that is opposing or distal to the bottom plate 202 (i.e. the display surface of the first display panel 101).

In order to make the display apparatus exhibit a regular geometric structure for easy carrying, according to some embodiments of the display apparatus, the side ridge 201 is connected to, and arranged to be perpendicular to a top surface of, the bottom plate 202 in the mounting frame, as illustrated in any one of FIG. 2A, FIG. 2B, and FIG. 2C.

By such a configuration (i.e. the side ridge 201 is perpendicularly connected to the bottom plate 202) of the mounting frame, each of the plurality of display panels can be conveniently mounted onto the mounting frame, and the display apparatus has a high aesthetic value and is convenient for carrying by a user.

The at least one second display panel 102 can include one or more than one display panel. In embodiments where the at least one second display panel comprises more than one display panel, the number of the second display panels can be an odd number, or can be an even number.

For example, in the embodiments as shown in FIG. 1 or FIG. 2A, the display apparatus includes an even number (specifically a total of two) of second display panels 102 (102a and 102b), and in the embodiments as shown in FIG. 2B or FIG. 2C, the display apparatus includes an odd number (specifically a total of three) of second display panels (102c, 102d, and 102e). It is noted that these embodiments shall not be construed as limitations to the number of display panels included in the display apparatus disclosed herein.

Figure 2D:
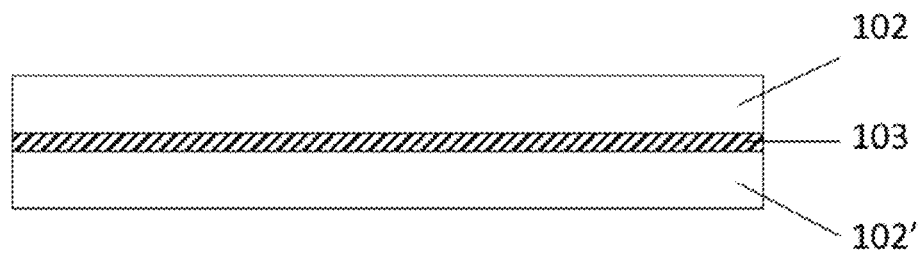
FIG. 2D illustrates a structural diagram of the bonding of two adjacent display panels to form a duel-side display panel assembly.

Regardless of having an odd number or an even number of the second display panels, in the display apparatus, as illustrated in FIG. 2D, two adjacent second display panels (102 and 102') can be bonded, having their respective non-display surfaces attaching to each other via an optically clear adhesive (OCA, 103), to substantially form a duel side-display panel assembly, which can thus realize a duel-side display.

For example, in the display apparatus as illustrated in FIG. 2A, the second display panel 102a and the second display panel 102b are arranged to have their respective non-display surface bonded together by OCA 103, and substantially form a duel-side display panel assembly. In the display apparatus as illustrated in FIG. 2B, the second display panel 102c and the second display panel 102e are arranged to have their respective non-display surface bonded together by OCA 103, and substantially form a duel-side display panel assembly. In the display apparatus as illustrated in FIG. 2C, the second display panel 102e and the second display panel 102d are arranged to have their respective non-display surface bonded together by OCA 103, and substantially form a duel-side display panel assembly.

It is noted that these above embodiments as illustrated in FIG. 2A, FIG. 2B, and FIG. 2C shall not be construed as limitations to the configuration of display panels included in the display apparatus disclosed herein.

It is also noted that it is possible that the at least second display panel 102 can include one or more duel-side display panel. In other words, each second display panel 102 itself is a duel-side display panel without involving bonding of non-display surfaces of two adjacent second display panel.

As such, in the display apparatus disclosed herein, the at least one second display panel can comprise more than one display panel, and at least one pair of two adjacent second display panels can be configured to be bonded together by attaching the non-display surfaces thereof respectively, to thereby form a duel-side display panel assembly for each of the at least one pair of two adjacent second display panels in the display apparatus.

To further realize a touch control functionality, the display apparatus can be configured such that each of the plurality of display panels is a touch-control display panel, which can negate the requirement for arranging a keyboard, and can result in an increased display area for the each of the plurality of display panels. In one example as illustrated in FIG. 1, the display panel 102a can be used as a display panel for displaying a content, and the display panel 102b that is adjacent to the display panel 102a can be used as a touch-control panel, which together substantially constitute the tablet mode for the display apparatus.

Specifically, the display apparatus shown in FIG. 2A comprises a total of three display panels, including a first display panel 101 and two second display panels (102a and 102b). One second display panel 102a is arranged to be relatively closer to the first display panel 101, and anther second display panel 102b is arranged to be relatively farther from the first display panel 101.

Further as illustrated in FIG. 2A, the two second display panels 102a and 102b are configured such that a non-display surface of the one second display panels 102a and a non-display surface of the another second display panel 102b are bonded to each other via the optically clear adhesive (OCA) 103. Thereby the two second display panels 102a and 102b substantially form a duel-side display panel assembly.

In each of the two embodiments of the display apparatus as respectively illustrated in FIG. 2B and FIG. 2C, the at least one second display panel comprises a total of three display panels (i.e. an odd number of display panels) 102c, 102e, and 102d, arranged to be stacked together over the first display panel 101 in an order from closest to the first display panel 101 to farthest away from the first display panel 101.

In one embodiment of the display apparatus as illustrated in FIG. 2B, the two adjacent second display panels 102c and 102e are configured such that their respective non-display surfaces are bonded to each other via the optically clear adhesive (OCA) 103. Thereby the two second display panels 102c and 102e substantially form a duel-side display panel assembly. The second display panel 102d is still configured as a single-side display panel, whose display surface can be arranged to face towards or opposing the second display panel 102c.

In another embodiment of the display apparatus as illustrated in FIG. 2C, the two adjacent second display panels 102e and 102d are configured such that their respective non-display surfaces are bonded to each other via the optically clear adhesive (OCA) 103. Thereby the two second display panels 102d and 102e substantially form a duel-side display panel assembly. The second display panel 102c is still configured as a single-side display panel, whose display surface can be arranged to face towards or opposing the first display panel 101.

Further as shown in FIG. 2A, FIG. 2B, and FIG. 2C, in order to protect the uppermost or outermost display panel (i.e. the display panel 102b in the embodiments illustrated in FIG. 2A, and the display panel 102d in the embodiments as illustrated in FIG. 2B and FIG. 2C) from being damaged by an external force, the display apparatus further includes a transparent flexible cover 300.

The transparent flexible cover 300 is disposed over a surface of the at least one second display panel opposing to the first display panel 101, and more specifically is disposed over a surface of the uppermost second display panel opposing to the first display panel 101. The transparent flexible cover 300 is arranged such that a side edge thereof is attached to the side ridge 201.

Specifically, as illustrated in FIG. 2A, the transparent flexible cover 300 is disposed over a surface of the second display panel 102b that is opposing or distal to the first display panel 101. Specifically, as illustrated in FIG. 2B or FIG. 2C, the transparent flexible cover 300 is disposed over a surface of the second display panel 102d that is opposing to the first display panel 101.

There are a variety of ways to attach the transparent flexible cover 300 to the side ridge 201. For example, a clamp can be employed to attach the transparent flexible cover 300 onto the side ridge 201, or an adhesive can be used to bond the transparent flexible cover 300 to the side ridge 201. Other ways are also possible.

Because the transparent flexible cover 300 is transparent, it allows the normal display for the second display panel (e.g. 102b in FIG. 2A, or 102d in FIG. 2B and FIG. 2C) without much influence.

In order for the transparent flexible cover 300 to provide a maximal protection to the plurality of display panels in the display apparatus disclosed herein, it is further configured such that the transparent flexible cover 300 fittingly contacts/attaches the second display panel that is immediately next to the transparent flexible cover 300 (i.e. the uppermost/outermost second display panel on a side farthest away from the first display panel 101).

In the following, the embodiment of the display apparatus as illustrated in FIG. 2A having a total of three display panels will be described in detail as an illustrating example for the display apparatus disclosed herein.

In the display apparatus as illustrated in FIG. 2A, the side ridge 201 not only provides a means for attaching a side edge of each of the at least one second display panel thereonto to thereby allow a flip-opening and/or flip-closing of each second display panel along the side edge thereof, the side ridge 201 is further configured to be electrically connected to the first display panel 101, and to the at least one second display panel.

Furthermore, the side ridge 201 is configured to allow an electrical connection between the first display panel 101 and the at least one second display panel and the central control circuit that is disposed inside the side ridge 201, thereby allowing the central control circuit to control the display state of the first display panel 101 and each of the at least one second display panel.

There are multiple ways for arranging the electrical coupling between the side ridge 201 and the first display panel 101 and each of the at least one second display panel.

Figure 3A:
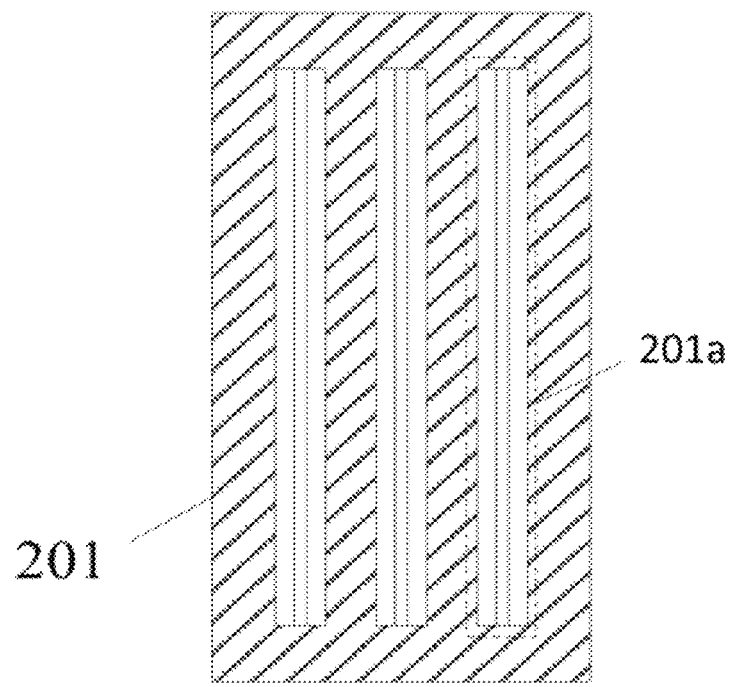
FIG. 3A illustrates a diagram of a side ridge arranged in a mounting frame of a display apparatus according to some embodiments of the disclosure.

In a first manner as illustrated in FIG. 3A, the side ridge 201 is provided with a plurality of slots (or grooves) 201a (illustrated in the box of dotted lines in FIG. 3A) on one side surface of the side ridge 201. Each of the plurality of slots 201a is configured to provide a means for the electrical coupling between the side ridge 201 and any of the first display panel 101 and the at least one second display panel plugged thereinto.

Each of the first display panel 101 and the at least one second display panel can be provided with a plugging portion at the side edge thereof (not shown in the drawings), that can be fitting plugged into a corresponding slot 201a in the side ridge 201 to thereby realize the electrical coupling between the side ridge 201 and any of the first display panel 101 and the at least one second display panel.

It is noted that in addition to this above configuration, the side ridge 201 can be provided with a plurality of plugging portions, each configured to be fittingly plugged into a corresponding slot on the side edge of each display panel to allow the electrical coupling therebetween (not shown in the drawings).

Figure 3B:
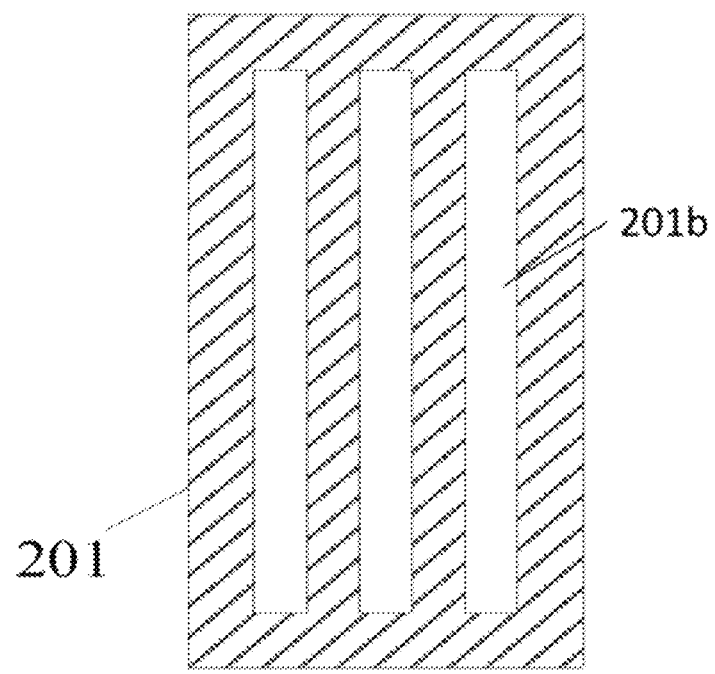
FIG. 3B illustrates a diagram of a side ridge arranged in a mounting frame of a display apparatus according to some other embodiments of the disclosure.

In a second manner as illustrated in FIG. 3B, the side ridge 201 is provided with a plurality of contact circuits 201b (shown as the unfilled regions in FIG. 3B) on one side surface of the side ridge 201. Each of the plurality of contact circuits 201b can comprise a chip-on-film (COF) circuit or a flexible printed circuit (FPC), which is configured to provide a means for the electrical coupling between the side ridge 201 and any of the first display panel 101 and the at least one second display panel attached thereonto. Correspondingly, each display panel is provided with a corresponding contact circuit that can specifically form an electrical connection/coupling with one of the plurality of contract circuits on the side ridge 201 (not shown in the drawings).

It is noted that in addition to this above configuration, each display panel can be provided with a contact circuit (e.g. COF or FPC) at a side edge thereof, and the side ridge can correspondingly be provided with a plurality of corresponding contact circuits, each configured to form an electrical coupling with the contact circuit in the side edge of each display panel (not shown in the drawings).

It is noted that the first manner and the second manner as described above can be mixed to realize the electrical coupling between the side ridge 201 and any of the first display panel 101 and the at least one second display panel. In other words, the side ridge 201 can be provided with at least one slot 201a and at least one contact circuit 201b, which are configured to correspondingly provide a means for electrical coupling between the side ridge 201 and any of the first display panel 101 and the at least one second display panel plugged thereinto and/or attached thereonto.

Figure 4:
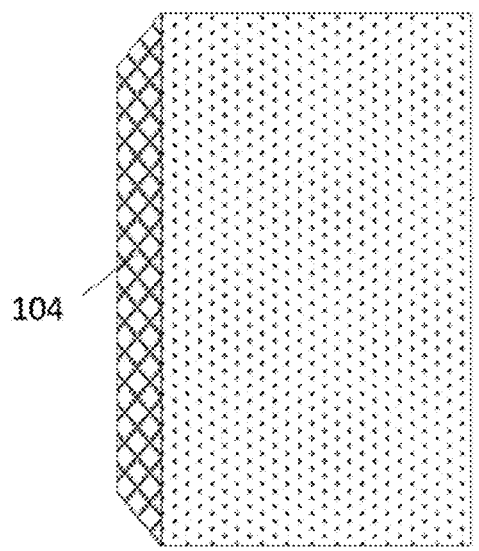
FIG. 4 illustrates a top view of a structural diagram of one of the plurality of display panels in the display apparatus according to some embodiments of the disclosure.

FIG. 4 illustrates a top view of a structural diagram of one of the plurality of display panels in the display apparatus having the side ridge 201 as illustrated in FIG. 3A. Specifically, in the display apparatus as described herein, the side ridge 201 is provided with a plurality of slots 201a, which correspond to the plurality of display panels in a one-to-one relationship.

Correspondingly each of the plurality of display panels comprises a plugging portion 104, disposed at the side edge thereof configured for attachment with the side ridge 201. The plugging portion 101a is configured to fittingly insert or plug into, and to electrically connect with, one of the plurality of slots 201a corresponding thereto on a side surface of the side ridge 201 of the mounting frame.

It is noted that in order to simplify the manufacturing process and to realize the batch manufacturing, each of the plurality of display panels can be configured to have a plugging portion 104 thereof that has a substantially same size and structure.

It is further noted that there can be multiple ways to realize an attachment and/or an electrical coupling between the first display panel 101, which is disposed over a top surface of the bottom plate 202 of the mounting frame, with the side ridge 201.

In one way, the first display panel 101 can be attached with, and be electrically connected to, the side ridge 201 by means of a plugging portion 104 arranged at the side edge thereof configured for attachment with the side ridge 201, as described above and illustrated in FIG. 4.

In another way, the first display panel 101 can be attached with the bottom plate 202 of the mounting frame by bonding, clamping, or other mounting manners, and can be further electrically connected to the side ridge 201 (esp. the central control circuit in the side ridge 201) by a wiring embedded into the bottom plate 202.

In the display apparatus as shown in FIG. 2A, the side ridge 201 can be provided with three slots 201a, which has a one-to-one corresponding relationship with the three display panels in the display apparatus, as illustrated in FIG. 3A and FIG. 4. It is noted that there is no limitation to the number of the plurality of slots 201a that are arranged in the side ridge 201.

For example, the side ridge 201 can be provided with at least one extra slot 201a (not shown in the drawings), which is typically unoccupied, but when needed, the at least one extra slot 201a allows the plug-in of additional display panels to be plugged thereinto. Thereby the number of display panels can be increased in the display apparatus, which substantially makes the display apparatus expandable for adding new display panels.

In order to realize an electrical coupling between each of the plurality of display panels with a corresponding slot 201a, specifically, each slot 201a can be provided with a first wiring, and the plugging portion 104 of each display panel is provided with a second wiring that can fittingly match the first wiring to realize the electrical coupling when the plugging portion 104 is plugged into the slot 201a.

As such, when a display panel is plugged into a corresponding slot 201a, by means of the electrical coupling between the first wiring and the second wiring, the display panel can be electrically coupled with the corresponding slot 201a, which in turn results in an electrical coupling between the display panel and the central control circuit to thereby allow the central control circuit to control a display state of the display panel.

According to some embodiments of the display apparatus where the side ridge 201 thereof has a configuration as illustrated in FIG. 3B, the side ridge 201 is provided with a plurality of contact circuits 201b on one side surface of the side ridge 201 that faces the plurality of display panels. Each of the plurality of contact circuits 201b can comprise a chip-on-film (COF) or a flexible printed circuit (FPC), configured to provide a means for the electrical coupling between the side ridge 201 and the plurality of display panels attached thereonto.

Specifically, in the display apparatus as shown in FIG. 2A, the display apparatus includes a total of three display panels. Accordingly, the side ridge 201 can be provided with three contact circuits (COF or FPC), configured to allow an electrical coupling between each of the three display panels and the side ridge 201 via a contact circuit corresponding thereto, as shown in FIG. 3B.

Herein there can be more than three contact circuits that are configured in the side ridge 201. In other words, the side ridge 201 can be provided with at least one extra contact circuit 201b (not shown in the drawings), which allows the addition of a new display panel in the display panel where needed. Thereby the number of display panels can be increased in the display apparatus, which substantially makes the display apparatus expandable for adding display panels.

Specifically, in order to protect a driving chip that are arranged on a side of each of the plurality of display panels, the driving chip can be configured to have a bent side, which is fixedly arranged inside the side ridge. According to some embodiments of the display apparatus, each second display panel is configured to have a bent region, which is provided with a contact circuit that electrically connects with a corresponding contact circuit in the side ridge.

Figure 3C:
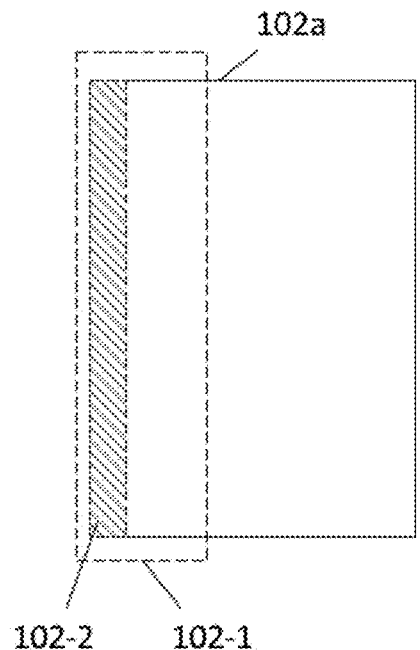
FIG. 3C illustrates a second display panel having a contact circuit arranged within a bent region thereof according to some embodiments of the disclosure.

As illustrated in FIG. 3C, one second display panel 102a has a bent region 102-1, and the contact circuit 102-2 is arranged on the side edge within the bent region 102-1. The contact circuit 102-2 is configured to form an electrical connection with a corresponding contact circuit 201b on the side ridge 201 as shown in FIG. 3B to thereby realize an electrical coupling between the one second display panel 102a and the side ridge 201.

According to some embodiments, in addition to the side ridge, the mounting frame further includes a rim at each of the three sides other than the side where the side ridge 201 is disposed. In the embodiment of the display apparatus as illustrated in the three-dimensional view in FIG. 5A, a top view in FIG. 5B, a front view in FIG. 5C, and a side view in FIG. 5D, the three rims 203 is attached with the bottom plate 202.

As such, the three rims 203, the side ridge 201, and the bottom plate 202 of the mounting frame together form an accommodating housing 400, and at least the first display panel is disposed in the accommodating housing 400.

Figure 5A:
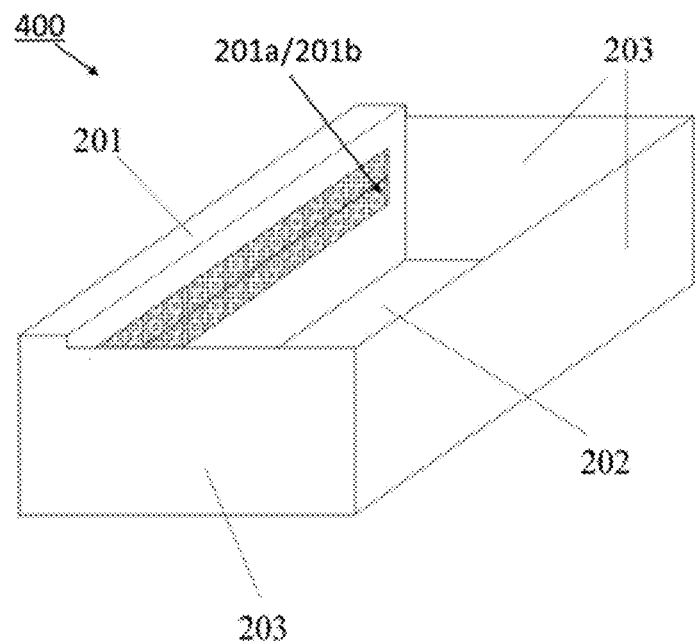
FIG. 5A illustrates a three-dimension view of an accommodating housing provided by some embodiments of the disclosure.
Figure 5B:
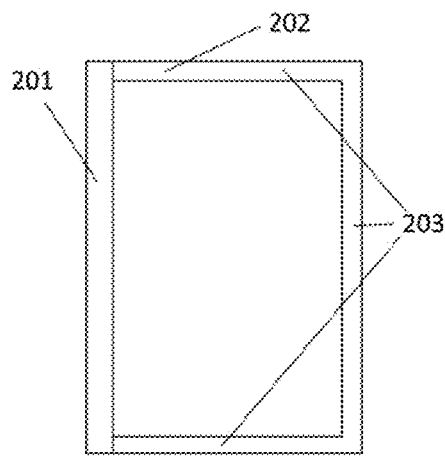
FIGS. 5B, 5C and 5D respectively illustrate a top view, a front view, and a side view of an accommodating housing provided by some embodiments of the disclosure.
Figure 5C:
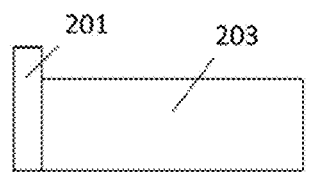

Specifically, in some embodiments, the accommodating housing 400 is configured to accommodate only the first display panel, as illustrated in FIG. 5A.

As shown in FIG. 5A, a slot 201a or a contact circuit 201b that is specifically configured to connect the first display panel with the side ridge 201 is arranged in a first portion of the side ridge 201 that is inside the accommodating housing 400. Other slot 201a or other contact circuits 201b that are specifically configured to connect any of the at least one second display panel with the side ridge 201 is arranged in a second portion of the side ridge 201 that is outside the accommodating housing (not shown in the figure).

Herein "the slot 201a/contact circuit 201b is inside the accommodating housing" is defined as a situation where a distance between the slot 201a/contact circuit 201b and the bottom plate 202 is lower than a distance between an uppermost side of each of the three rims 203 and the bottom plate 202, whereas "the slot 201a/contact circuit 201b is outside the accommodating housing" is defined as a situation where a distance between the slot 201a/contact circuit 201b and the bottom plate 202 is higher than a distance between an uppermost side of each of the three rims 203 and the bottom plate 202.

Figure 6:
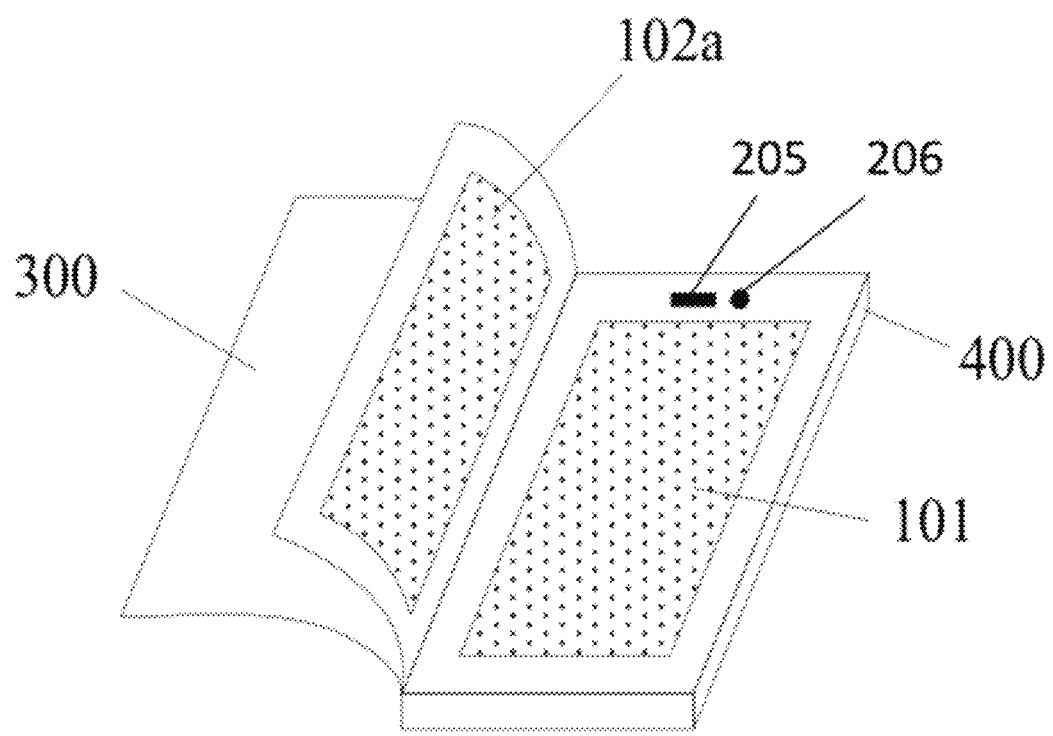
FIG. 6 illustrates a three-dimension view of a structural diagram of a display apparatus according to some embodiments of the disclosure.

FIG. 6 illustrates a three-dimension view of a structural diagram of a display apparatus according to some embodiments of the disclosure. As shown in the figure, the display apparatus comprises a first display panel 101 and at least one second display panel, with an outermost second display panel 102a.

The first display panel 101 is arranged inside an accommodating housing 400. Each of the at least one second display panel is disposed outside the accommodating housing 400. The display apparatus further comprises a transparent flexible cover 300, disposed over and fittingly attach, an upper surface of the second display panel 102a (in a similar manner for the transparent flexible cover 300 and the second display panel 102b as illustrated in FIG. 2A).

It is noted that in FIG. 6, in order to clearly illustrate the positional relationship between the transparent flexible cover 300 and the second display panel 102a, the transparent flexible cover 300 is shown as loosely connected with the side ridge 201, but not shown as fittingly contacting/attaching the second display panel 102a.

In the display apparatus as illustrated in FIG. 6, because one side edge of each of the at least one second display panel 102 is fixedly attached with the side ridge 201, whereas other side edges remain unattached and movable, each of the at least one second display panel can thus be flipped open or flipped close, like opening or closing a page of a book. It is noted that in FIG. 6, for simplicity, only the uppermost second display panel 102a is shown to be flipped open.

As such, the users' needs for multiple display panels can be satisfied, and additionally, due to the book-opening/closing like manner for use of the display panel, the user's experience can be improved.

In addition to the above embodiment of the display panel where only the first display panel is arranged in the accommodating housing 400, the accommodating housing 400 can be configured to accommodate one or more second display panels (not shown in drawings). Accordingly, the slots 201a or the contact circuits 201b that correspond to the one or more second display panels are arranged in the second portion of the side ridge 201 (i.e. the portion that is inside the accommodating housing 400).

It is noted that besides the above mentioned embodiments where the mounting frame of the display apparatus is provided an accommodating housing 400, formed by the side ridge 201, the bottom plate 202, and the three rims 203, the mounting frame may only have the side ridge 201 and the bottom plate 202, and is provided with no rims. As such, in these other embodiments of the display apparatus, the mounting frame is not provided an accommodating housing 400.

According to some embodiments, the display apparatus can be provided with a triggering portion, disposed on a surface of the mounting frame (not shown in the drawings). The triggering portion can comprise one or more triggering members, each corresponding to one of the plurality of display panels and configured, upon receiving a trigger by the user, to trigger a corresponding second display panel to be flipped open or close.

Herein each of the one or more triggering members in the triggering portions can be a button, a knob, or a function mechanism (such as an optical sensor, or a virtual button displayed in a touch control panel), that can receive a trigger from the user to realize the mechanical, electrical, or an electro-mechanic triggering of the flipping open/close of the corresponding display panel.

The one or more triggering members in the triggering portions can be arranged on a side surface of the side ridge 201, and in the embodiments where the first display panel 101 and one or more second display panel are arranged inside an accommodating housing 400, the one or more triggering members in the triggering portions can be arranged on a surface of one of the rims of the mounting frame.

According to some embodiments, the display apparatus can further include at least one functional slot, configured to allow addition of new functionalities and/or expansion of current functionalities by means of one or more functional cards that are plugged in the at least one functional slot.

Figure 5D:
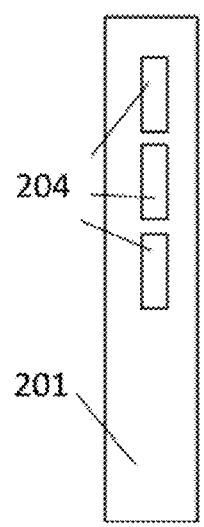

In some embodiments, the display apparatus includes at least one identification card slot 204, as illustrated in FIG. 5D. The at least one identification card slot 204 can be arranged in any portion of the mounting frame other than the accommodating housing. Each of the at least one identification card slot is electrically coupled to the central control circuit, and is configured to be plugged in by an identification card to thereby allow the central control circuit to determine the identity of the user based on the identification information in the identification card.

Herein the identification card can be a SIM card, and correspondingly the at least one identification card slot 204 are each a SIM card slot.

Specifically, the at least one identification card slot 204 can consist of only one identification card slot, which can be electrically coupled to the central control circuit such that the central control circuit can, upon plugging the identification card into the identification card slot, read the identification information corresponding to the identification card, control the display of the identification information corresponding to the identification card by each of the plurality of display panels, and optionally, further control the display state and the display contents of each of the plurality of display panels based on the identification information.

The at least one identification card slot 204 can include more than one identification card slot, as illustrated in FIG. 5D, and can, for example, include a same number of identification card slots as the number of the display panels. The more than one identification card slot is electrically coupled to the central control circuit, which can read the identification information corresponding to the identification card plugged into one of the at least one identification card, and can control the display of the identification information by, and optionally of the contents to be displayed by, the plurality of display panels based on the identification information.

As such, the identification card slots and the display panels can be configured to have a corresponding relationship with one another, thereby realizing the display of different identification information and corresponding contents by different display panels.

It is noted that in addition to the at least one identification card slot 204 as mentioned above, the display apparatus may also comprise at least one expansion slot, arranged in any portion of the display apparatus, and electrically coupled to the central control circuit. The at least one expansion slot is configured to allow a plug-in of an expansion card to thereby realize addition of an extra functionality to the display apparatus.

In one example, the at least one expansion slot comprises a memory storage card slot, which allows the plug-in of a memory storage card (e.g. an SD card), to thereby allow an increase of memory to the display apparatus, bringing a convenience to the user.

It is further noted that besides the at least one expansion slot as described above, the display apparatus may comprise at least one sensor, which can be arranged in any portion of the display apparatus, and can be electrically coupled to the central control circuit. The at least one sensor is configured to detect, and to send to the central control circuit, at least one of biometrics information or control signal from the user.

Figure 5E:
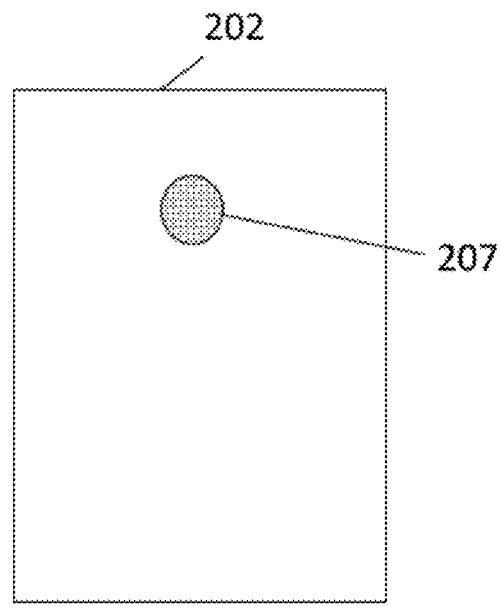
FIG. 5E is a bottom view of a display apparatus having a fingerprint sensor according to some embodiments of the disclosure.

For example, as illustrated in FIG. 5E, the display apparatus may include a fingerprint sensor 207, which is arranged on a bottom surface of the bottom plate 202 (i.e. a surface thereof opposing to the first display panel 101), and is configured to detect a fingerprint of a user to thereby determine the identity of the user.

According to some embodiments, the display apparatus further comprises a display control portion, comprising at least one display controller, which is arranged on a surface of the mounting frame other than the accommodating housing.

Each display controller of the display control portion is electrically coupled to the central control circuit, and is configured to receive a control signal from the user, and send the control signal to the central control circuit.

Figure 5F:
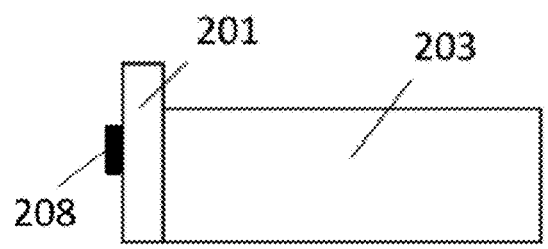
FIG. 5F is a side view of a display apparatus having a display controller according to some embodiments of the disclosure.

FIG. 5F illustrates one embodiment of the display apparatus, where a display controller 208 is arranged on a surface of the side ridge 201 opposing to the accommodating housing.

Specifically, in some embodiments of the display apparatus, the display control portion consists of only one display controller. Accordingly, the control signal that is received from the user by the one display controller, and then transmitted to the central control circuit includes a first control sub-signal, configured for controlling a display state of one display panel, or a second control sub-signal configured for controlling a display state of two display panels.

Based on the different control sub-signals (i.e. the first control sub-signal and the second control sub-signal), the central control circuit can control the display state of each display panel.

In one example, upon receiving the first control sub-signal from the display controller of the display control portion, the central control circuit can control one display panel (e.g. the first display panel 101) to display contents. Upon receiving the second control sub-signal from the display control portion, the central control circuit can control two display panels (e.g. the first display panel 101 and an adjacent second display panel 102a, illustrated in FIG. 2A) to display different contents.

In some other embodiments of the display apparatus, the display control portion comprises more than one display controller. For example, the display control portion of the display apparatus may include a total of four display controllers, including a wake-up display controller, a single-panel display controller, a double-panel display controller, and a double-mode display controller.

The wake-up display controller is configured to receive a third control sub-signal from a user, and then to send the third control sub-signal to the central control circuit for waking up the display panel for display.

The single-panel display controller is configured to receive a fourth control sub-signal from a user, and then to send the fourth control sub-signal to the central control circuit for allowing the display of one single display panel.

The double-panel display controller is configured to receive a fifth control sub-signal from a user, and then to send the fifth control sub-signal to the central control circuit for allowing the display of two display panels.

The double-mode display controller is configured receive a sixth control sub-signal from a user, and then to send the sixth control sub-signal to the central control circuit for starting two different modes for two display panels (e.g. a touch-control mode for one display panel, and a display mode for the other display panel).

Upon receiving the different control sub-signals (i.e. the third control sub-signal, the fourth control sub-signal, the fifth control sub-signal, and the sixth control sub-signal) from the display control portion, the central control circuit can control the display state (i.e. wake-up, single-panel, double-panel, or double-mode) of the plurality of display panels in the display apparatus.

It is noted that in any of the embodiments of the display apparatus as described above, the display controller of the display control portion can be a physical button, a touch-control button, or their combinations, but can also be a component of another type that is capable of display control.

According to some embodiments, the display apparatus further comprises a wake-up sensor, which is disposed, for example, at a non-display region of each display panel. The wake-up sensor is configured, upon detecting that a user is in front of a display panel, to wake up the display panel for display. Such a configuration abrogates the needs for arranging the aforementioned wake-up display controller, thus leading to a simplified user operation.

As shown in FIG. 6, the display apparatus can further comprise a speaker 205, configured to allow the user to listen to music and watch videos, and/or comprises at least one camera 206, configured to allow the user to take photos. The speaker 205 and the at least one camera 206 can be arranged on the mounting frame, such as on one rim 203 of the mounting frame in the accommodating housing 400, and they can be further configured to be electrically connected to the central control circuit.

Specifically, the at least one camera 206 can comprise a front-facing camera and a rear-facing camera. The front-facing camera is configured to allow a user to take photos of himself/herself, and the front-facing camera can be disposed in a portion of the mounting frame other than that used for mounting the first display panel and can be arranged to be on a same plane as the first display panel. Such a configuration brings convenience for the control by the central control circuit.

The rear-facing camera is configured to allow a user to take pictures of scenes or people on the rear side of the display apparatus. The rear-facing camera can be disposed on a surface of the bottom plate opposing to the first display panel. Optionally, the rear-facing camera can be configured to have a relatively high resolution, so as to meet the requirements for high-resolution photos.

It should be noted that all of the embodiments of the display apparatus as described above are based on the display apparatus as illustrated in FIG. 1A and FIG. 1B, where the side ridge 201 of the mounting frame is arranged to be perpendicular to a top surface of, the bottom plate 202 in the mounting frame. Other embodiments of the display apparatus are also possible.

Figure 7A:
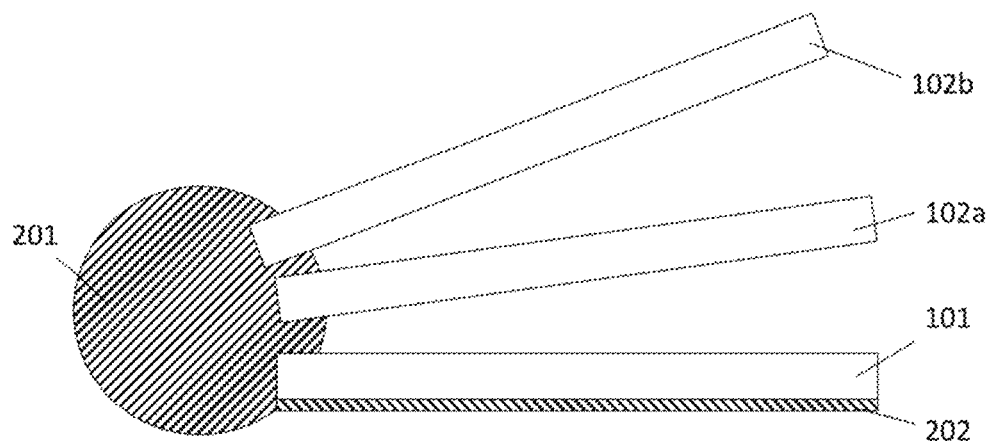
FIGS. 7A and 7B respectively illustrate a display apparatus having a plurality of display panels according to some embodiments of the disclosure.
Figure 7B:
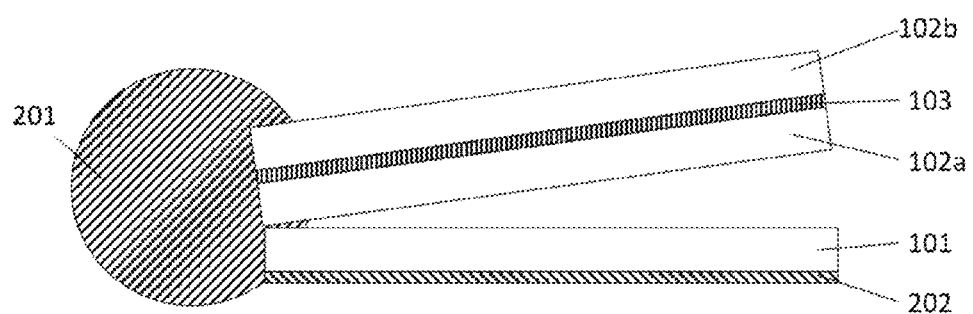

For example, in the embodiments of the display apparatus as illustrated in FIG. 7A and FIG. 7B, the display apparatus comprises a plurality of display panels (e.g. 101, 102a, and 102b), a mounting frame, which includes a side ridge 201 and a bottom plate 202, and a central control circuit disposed inside the side ridge 201. The first display panel is mounted onto the bottom plate 202.

In both two embodiments as shown in FIG. 7A and FIG. 7B, each of the plurality of display panels is hingedly attached with, and electrically connected to, the side ridge 201, allowing it to flipped open or flipped close along the side ridge 201 and to be electrically controlled by the central control circuit.

Further as illustrated in FIG. 7B, two adjacent second display panels (102a and 102b) can be bonded together, such that their respective non-display surfaces are bonded to each other via an optically clear adhesive (OCA, shown as 103) to substantially form a duel side-display panel assembly, which can thus realize a duel-side display.

Taken together, the display apparatus disclosed herein includes a plurality of display panels, a mounting frame configured for mounting each of the plurality of display panels, and a central control circuit configured to control a display status of each of the plurality of display panels upon receipt of control signals. The mounting frame includes a side ridge. The central control circuit is arranged inside the side ridge of the mounting frame. A side edge of each of the plurality of display panels is electrically coupled with the side ridge.

As such, the display apparatus is equipped with multiple display panels, and each display panel is able to display different contents, thereby meeting the needs of a user for multiple display modes, which can include, for example, a work mode, a family mode, an entertainment mode, and a tablet mode. In the tablet mode, one display panel can be used as a display panel for displaying contents, and another display panel can be used as a touch-control panel.

In the display apparatus, the plurality of display panels are controlled by a single central control circuit, thus the issue of control errors due to the interference of various systems in a conventional device can be effectively avoided, improving the control accuracy.

In addition, because the display apparatus employs display panels, which allow these display panels to be flip-opened and/or flip-closed without much influence on the display quality. As such, the user operates the display apparatus as turning pages of a book, which can greatly improve the user experience.

All references cited in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A display apparatus, comprising:
a plurality of display panels;
an accommodating housing, comprising a side ridge electrically coupled to each of the plurality of display panels; and
a central control circuit, arranged inside the side ridge;
wherein:
a side edge of each of the plurality of display panels is attached to the side ridge to thereby allow the each of the plurality of display panels to be flipped open or close along the side ridge;
the central control circuit is electrically coupled to each of the plurality of display panels, and is configured to control a display state of each of the plurality of display panels upon receiving a control signal from a user;
each of the plurality of display panels is electrically coupled to the side ridge via a coupling between a first coupling portion on the side ridge and a second coupling portion on the each of the plurality of display panels and corresponding to the first coupling portion; and
the first coupling portion and the second coupling portion are respectively provided as a first groove corresponding to the first display panel, and one or more second grooves corresponding to one or more second display panels, wherein each groove extends a majority of the length of the side ridge, the first groove being separate from the second groove by a ridge of material forming a portion of the side ridge, the quantity of grooves corresponding in a one-to-one ratio with the quantity of display panels.

2. The display apparatus according to claim 1, wherein:
the accommodating housing further comprises a bottom plate attached to the side ridge;
the plurality of display panels comprise a first display panel and at least one second display panel, wherein:
a non-display surface of the first display panel is mounted onto the bottom plate; and
the at least one second display panel is disposed over a surface of the first display panel opposing to the bottom plate.

3. The display apparatus according to claim 1, wherein at least one pair of two adjacent display panels are arranged such that a non-display surface of each of the two adjacent display panels is attached to one another to substantially form a duel side-display panel assembly.

4. The display apparatus according to claim 3, wherein the non-display surface of the each of the two adjacent display panels is attached to one another via a layer of an optically clear adhesive (OCA).

5. The display apparatus according to claim 1, wherein each of the plurality of display panels is electrically coupled to the side ridge via a coupling between a first coupling portion on the side ridge and a second coupling portion on the each of the plurality of display panels and corresponding to the first coupling portion.

6. The display apparatus according to claim 5, wherein:
the first coupling portion and the second coupling portion are respectively one and another of a slot or a plugging portion.

7. The display apparatus according to claim 5, wherein the coupling is a contact connection, wherein:
the first coupling portion and the second coupling portion are respectively one and another of a contact circuit or a corresponding contact circuit.

8. The display apparatus according to claim 7, wherein the contact circuit is a chip-on-film (COF) circuit or a flexible printed circuit (FPC).

9. The display apparatus according to claim 7, wherein each of the at least one second display panel comprises a bent region, and the second coupling portion is arranged in the bent region.

10. The display apparatus according to claim 5, wherein the side ridge is provided with a larger number of the first coupling portions than the plurality of display panels.

11. The display apparatus according to claim 2, wherein the accommodating housing further comprises at least one rim, configured to form an accommodating housing along with the side ridge and the bottom plate, wherein:
the first display panel is in the accommodating housing.

12. The display apparatus according to claim 1, further comprising a display control portion comprising at least one display controller, wherein:
each of the at least one display controller is arranged on a surface of the accommodating housing other than the accommodating housing, is electrically coupled to the central control circuit, and is configured to receive a control signal from the user, and then to send the control signal to the central control circuit.

13. The display apparatus according to claim 12, wherein:
the display control portion consists of one display controller; and
the control signal comprises:
a first control sub-signal, configured to control a display state of one of the plurality of display panels; or
a second control sub-signal, configured to control a display state of two of the plurality of display panels.

14. The display apparatus according to claim 12, wherein the display control portion comprises:
a wake-up display controller, configured to receive a third control sub-signal from the user, and then to send the third control signal to the central control circuit for waking up one of the plurality of display panels for display;
a single-panel display controller, configured to receive a fourth control sub-signal from the user, and then to send the fourth control sub-signal to the central control circuit for allowing one of the plurality of display panels to display;
a double-panel display controller, configured to receive a fifth control sub-signal from the user, and then to send the fifth control sub-signal to the central control circuit for allowing two of the plurality of display panels to display; and
a double-mode display controller, configured receive a sixth control sub-signal from the user, and then to send the sixth control sub-signal to the central control circuit for starting two different modes for two of the plurality of display panels.

15. The display apparatus according to claim 12, wherein each of the at least one display controller in the display control portion comprises at least one of a physical button or a touch-control button.

16. The display apparatus according claim 1, further comprising at least one functional slot, electrically coupled to the central control circuit, wherein:
the at least one functional slot is configured to be plugged in by one or more functional cards to thereby allow addition or expansion of one or more functionalities for the display apparatus.

17. The display apparatus according claim 1, further comprising at least one sensor, electrically coupled to the central control circuit, wherein:
   the at least one sensor is configured to detect, and to send to the central control circuit, at least one of biometrics information or control signal from the user.

18. The display apparatus according to claim 2, further comprising a transparent flexible cover, wherein:
   the transparent flexible cover is disposed over a surface of the at least one second display panel opposing to the bottom plate; and
   a side edge of the transparent flexible cover is attached to the side ridge of the accommodating housing.

19. The display apparatus according to claim 1, wherein the plurality of display panels comprises at least one flexible display panel.

20. The display apparatus according to claim 19, wherein each of the at least one flexible display panel is an OLED display panel.

* * * * *